United States Patent
Brillon et al.

(10) Patent No.: US 7,187,182 B2
(45) Date of Patent: Mar. 6, 2007

(54) PROCESS FOR THE CONNECTION OF ELECTRICAL LOADS TO THE TERMINALS OF AN AMPLIFIER, AND FOR DETECTION OF A POSSIBLE DEFECT OF CONNECTION OF THESE LOADS

(75) Inventors: Alain Brillon, Villeneuve Tolosane (FR); Olivier Costes, Cugnaux (FR)

(73) Assignee: Siemens VDO Automotive, Toulouse (FR)

( * ) Notice: Subject to any disclaimer, the term of this patent is extended or adjusted under 35 U.S.C. 154(b) by 0 days.

(21) Appl. No.: 11/218,664

(22) Filed: Sep. 6, 2005

(65) Prior Publication Data
US 2006/0049832 A1 Mar. 9, 2006

(30) Foreign Application Priority Data
Sep. 3, 2004 (FR) .................... 04 09326

(51) Int. Cl.
*G01R 31/02* (2006.01)
(52) U.S. Cl. .................. 324/537; 324/522; 324/713
(58) Field of Classification Search ................ 324/713, 324/537, 522
See application file for complete search history.

(56) References Cited

U.S. PATENT DOCUMENTS 5,999,002 A * 12/1999 Fasnacht et al. ............ 324/525
2001/0048367 A1 12/2001 Wimmer et al.

* cited by examiner

*Primary Examiner*—Vincent Q. Nguyen
(74) *Attorney, Agent, or Firm*—Young & Thompson

(57) ABSTRACT

A process and circuit for the connection of electrical loads to the terminals of an amplifier, and for detection of a possible connection defect of said electrical loads. An electrical load is connected to two terminals of the amplifier according to a complete-bridge mounting. At least one second electrical load is connected according to a half-bridge mounting. In a preliminary phase, reference values representative of the currents flowing in each of the connection branches are memorized and measured and there are detected from these measurements and memorized, the reference values of the currents flowing through each of the terminals. During operation of the amplifier, the current passing through each of the two terminals is measured and compared to the corresponding memorized reference value, so as to detect therefrom the connection branch or branches which suffer a connection defect of an electrical load.

4 Claims, 3 Drawing Sheets

PROCESS FOR THE CONNECTION OF ELECTRICAL LOADS TO THE TERMINALS OF AN AMPLIFIER, AND FOR DETECTION OF A POSSIBLE DEFECT OF CONNECTION OF THESE LOADS

BACKGROUND OF THE INVENTION

The invention relates to a process for connection of electrical loads to the terminals of an amplifier, and for detection of a possible defect of a connection of said electrical loads. It includes an amplification circuit using this process for connection and detection.

Existing automotive vehicles are conventionally provided with an access control device called a "hands free" and with several systems for surveillance and/or measurement of parameters, comprising detectors mounted on said vehicle, each of these monitoring devices and surveillance systems being provided with a low frequency emitter/receiver circuit having an antenna.

Conventionally, and as shown in FIG. 1, the antennas such as A1, A1 of these monitoring devices and surveillance systems are integrated in an amplification circuit comprising an amplifier Am, and are connected to the connection terminals such as B1, B2, B3 of this amplifier Am, as a function of their power:

either according to a complete bridge arrangement adapted to control again the "high" power antennas and consisting in connecting each of the poles of the antenna A1 to one of the terminals B1, B2 by means of an electrical connection branch P1, P2 having for example, according to FIG. 1, either a resistance R1 in series with a capacitance C1 (branch P1), or a resistance R2 alone (branch (P2)

or according to a half-bridge mounting adapted for the control of "low" power antennas, and consisting in connecting one of the poles of the antenna A2 to ground, and the other pole of this antenna A2 to a connection terminal B3 by means of an electrical connection branch P3 having for example a resistance R3 in series with a capacitance C2.

The principal advantage of such amplification circuits resides in the fact that they promote detecting a possible defect of connection of an antenna A1 or A2, and localizing the defective antenna.

On the other hand, such amplification circuits require a connection terminal B1–B3 for the connection of each of the electrical connection branches P1–P3 (hence three terminals for two antennas), and are thus costly in terms of investment in the amplifiers.

So as to overcome this last drawback, a present solution, shown in FIG. 2, consists in mounting two antennas A3, A4 in parallel between two electrical connection branches P4, P5 of a complete bridge mounting.

According to this principle, two antennas can be connected to an amplifier Am provided with two connection terminals B1, B2, such that an economy in terms of investment (there is saved a connection terminal on the amplifier Am) is enjoyed relative to the solution described in the first instance above.

However, this economy of investment is enjoyed at the detriment of the diagnostic function of the amplification circuit: an amplification circuit according to this second principle permits in effect detecting a possible connection defect, but does not permit distinguishing which of the two antennas A3, A4 is disconnected, and this no matter what the power, absolute or relative, of said antennas.

SUMMARY OF THE INVENTION

The present invention seeks to overcome the drawbacks of the present amplification circuits of the type described above, and has for its principal object to provide a process for connection permitting connecting a maximum number of electrical loads to the terminals of an amplifier, and to diagnose (identification and location) the possible defects of connection.

To this end, the invention provides, in a first instance, a process for connection of electrical loads to the terminals of an amplifier, and for detection of a possible defect of connection of said electrical loads, according to which:

an electrical load is connected to two terminals of the amplifier according to a complete bridge mounting consisting in connecting each of the poles of said electrical load to one of said terminals by means of an electrical connection branch, at least one second electrical load is connected according to a half-bridge mounting consisting in connecting one of the poles of each of said electrical loads to ground, and the other pole of this electrical load to one of the connection branches of the complete bridge, by an electrical connection branch, in a preliminary phase, reference values representative of the currents flowing in each of the connection branches of the complete bridge mounting and in the half-bridge mounting are measured and memorized, and there is deduced from these measurements and memorized the reference values of the currents passing through each of the two terminals, and during operation of the amplifier, the current flowing through each of the two terminals is measured and each measure value is compared to the corresponding memorized reference value, so as to detect a possible decrease in the measured current representative of a connection fault in the connection branch connected to the terminal in question, and upon a significance decrease in at least one of the measured currents, there is carried out a comparison of the measured values of the two currents passing through each of the two terminals with the memorized reference values representative of the currents passing through each of the connection branches, so as to detect therefrom the connection branch or branches which contain a connection fault of an electrical load.

In the first place, the process according to the invention permits connecting to each pair of connection terminals of an amplifier, on the one hand an electrical load according to a full-bridge mounting, and on the other hand one or two electrical loads according to half-bridge mountings. As a result, this process permits connecting up to three electrical loads on a single pair of connection terminals, and thus results in a noticeable economy in terms of cost of investment as to the amplification circuit.

According to a preferred embodiment, the process according to the invention can thus consist in connecting a first electrical load having a given electrical energy consumption, to two terminals of the amplifier, according to a complete-bridge mounting, and a second electrical load having an electrical energy consumption less than that of a first electrical load, according to a half-bridge mounting connected to one of the connection branches of the full-bridge mounting.

The process according to the invention can also consist, according to another preferred embodiment, in connecting a first electrical load to two terminals of the amplifier according to a full-bridge mounting, and two other electrical loads according to half-bridge mountings connected respectively each to one of the connection branches of the full-bridge mounting.

Moreover, and in an essential manner, the process according to the invention also permits, no matter what the number of electrical loads, equal to two or three electrical loads, connected to a pair of connection terminals, on the one hand to detect a possible connection fault, and on the other hand to locate the defective electrical load. Thus this process permits an exhaustive diagnosis (identification and location) of any possible defect of connection of an electrical load.

The invention includes an amplification circuit comprising an amplifier provided with at least two connection terminals, and at least one electrical load connected to the two connection terminals according to a full-bridge mounting constituted by two electrical connection branches of each of the poles of said electrical load to one of said connection terminals. According to the invention this amplification circuit comprises:

- at least one second electrical load connected according to a half-bridge mounting, constituted by a connection to the ground and by one of the poles of each of said electrical loads, and an electrical connection branch of the other pole of this electrical load to one of the connection branches of the full-bridge,
- means for memorizing reference values representative of currents circulating in each of the connection branches of the complete-bridge and half-bridge mountings, and for memorizing reference values of the currents passing through each of the two terminals,
- means for measuring the current passing through each of the two terminals,
- and a central unit programmed to compare each measured value to the corresponding memorized reference value, so as to detect a possible decrease of the measured current representative of a connection defect in a connection branch connected to the terminal in question, and upon a significant decrease of at least one of the measured currents, to proceed to a comparison of the measured values of the two currents passing through each of the two terminals with memorized reference values representative of the currents passing through each of the connection branches, so as to detect the connection branch or branches which suffer a connection defect of an electrical load.

BRIEF DESCRIPTION OF THE DRAWINGS

Other characteristics, objects and advantages of the invention will become apparent from the detailed description which follows, with reference to the accompanying drawings, which show, in the first instance, two amplification circuits of the prior art technique recited in the above preamble, and in the second instance, and by way of non-limiting example, two preferred embodiments of amplification circuits according to the invention. In these drawings.

DESCRIPTION OF THE PREFERRED EMBODIMENTS

Figure 1:
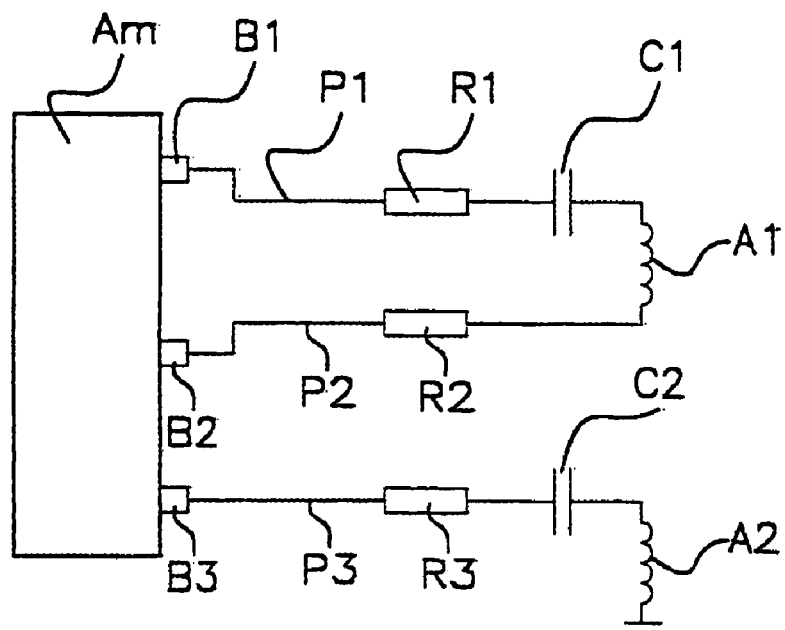
FIGS. 1 and 2 are schematics of two amplification circuits representative of the prior art of the technique, described in the above preamble.
Figure 2:
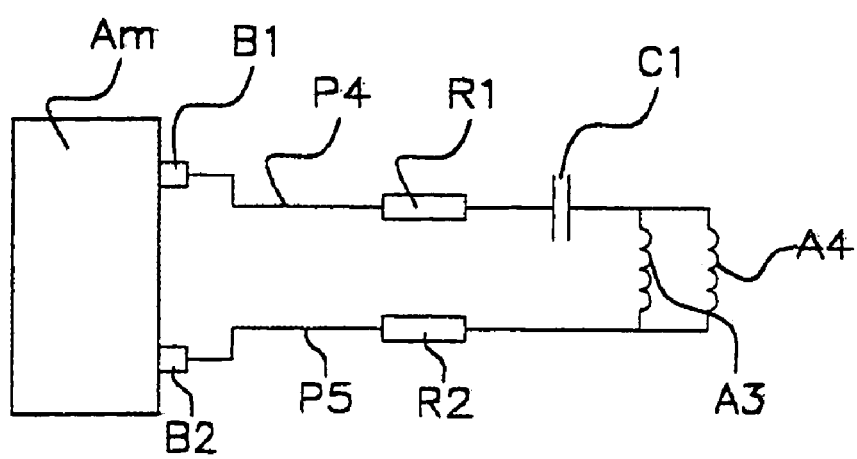
Figure 3:
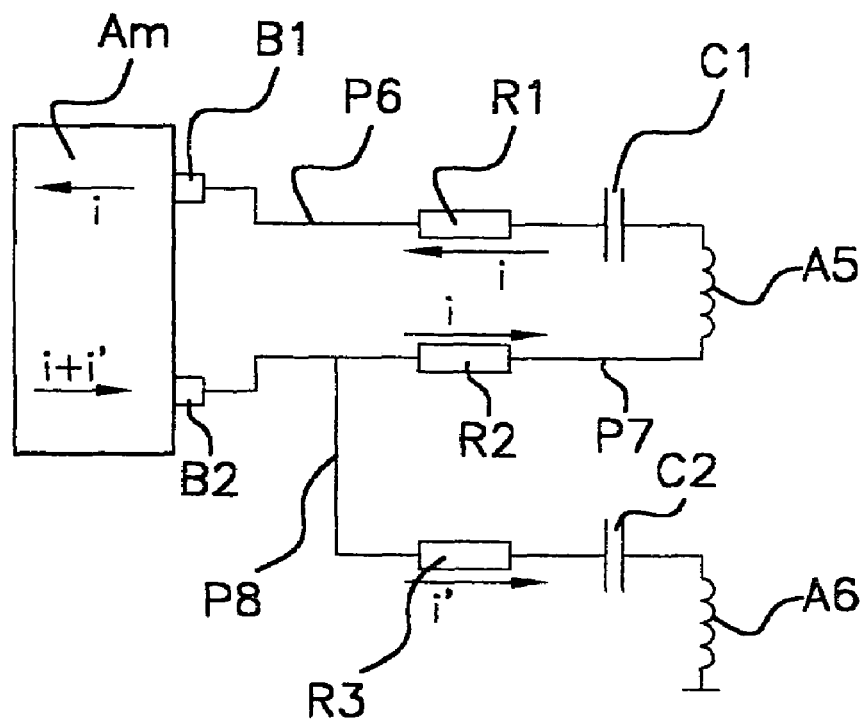
FIG. 3 is a schematic showing a first embodiment of amplification circuit according to the invention.
Figure 5:
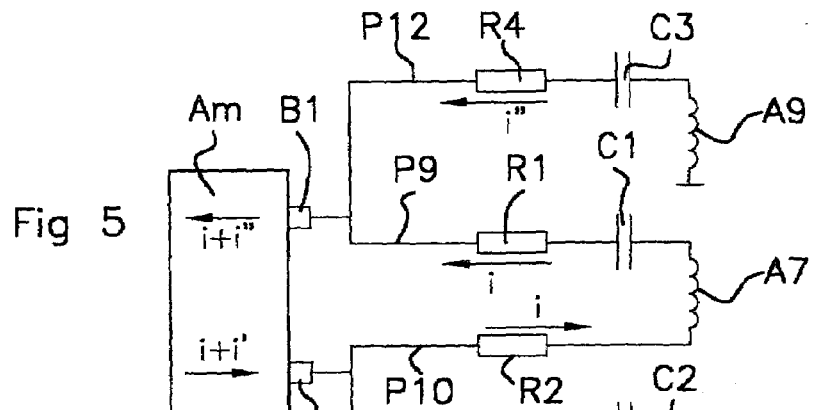
FIG. 5 is a schematic showing a second embodiment of the amplification circuit according to the invention.

The amplification circuit shown by way of example, respectively in FIGS. 3 and 5, comprises both an amplifier Am provided with two connection terminals B1 and B2, and are designed to permit connecting to said terminals, respectively two electrical loads A5, A6 (FIG. 3) or three electrical loads A7, A8, A9 (FIG. 5) each consisting in antennas for example of low frequency emitter/receiver circuits.

According to the embodiment shown in FIG. 3, one of the antennas A5 is connected to the amplifier Am by a complete-bridge mounting constituted by two electrical connection branches P6, P7 each connected to poles of said antenna at one of the connection terminals B1, B2.

The second antenna A6 of this amplification circuit is itself connected according to a half-bridge mounting constituted by a connection to ground of one of the poles of said antenna, and a branch P8 for electrical connection of the other pole of this antenna A6 to one of the electrical connection branches P7 of the complete bridge.

According to this embodiment, if the current flowing in the electrical connection branches P6, P7 of the complete bridge has a reference value i, and the current flowing in the electrical connection branch P8 of the half bridge has a reference value i', then:

the reference value of the current flowing through terminal B1 is equal to i, and the reference value of the current flowing through the terminal B2 is equal to i+i'.

During normal functioning of the amplification circuit, and as shown in FIG. 3, the currents measured at each of the terminals B1 and B2 are substantially equal to the memorized reference values (with a tolerance equivalent to the precision of conventional measuring means), and hence value i for the terminal B1 and i+i' for the terminal B2.

Figure 4:
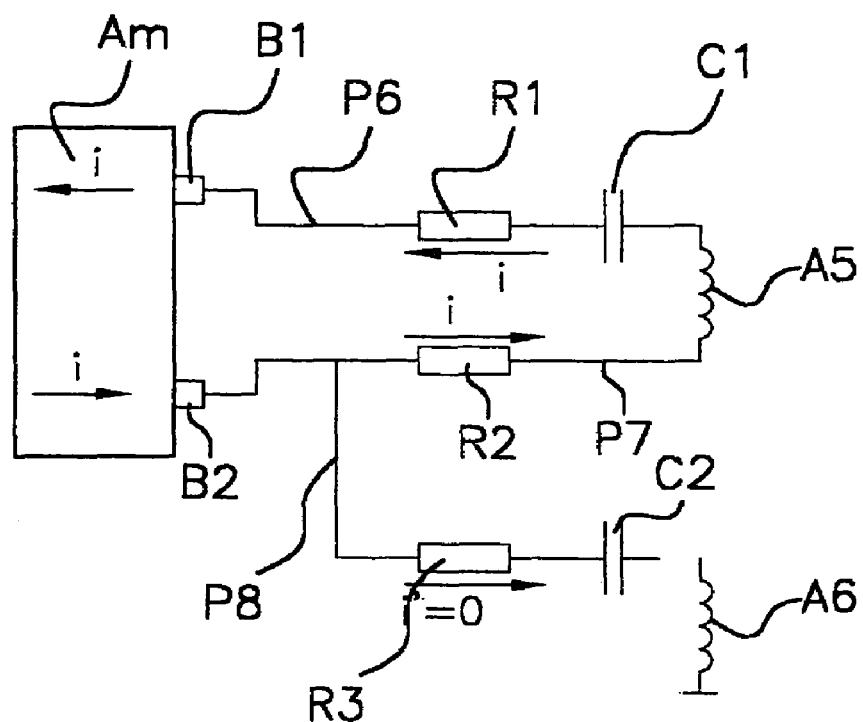
FIG. 4 is a schematic of this first embodiment shown with a connection defect.

On the other hand, upon connection defect of the antenna A6 connected according to the half-bridge mounting, and as shown in FIG. 4, the measured value of the current flowing through the terminal B1 remains unchanged and equal to i, but a decrease in the value flowing through the terminal B2 is detected because the current i' is annulled, such that a connection defect is detected in the first instance.

A comparison between the measured values of the current flowing through the two terminals B1 and B2 and the reference values, then permits detecting that the current flowing through these two terminals can only be the current flowing through the two connection branches P6 and P7 of the complete bridge. This comparison thus permits identifying the antenna A6 as being the disconnected antenna.

In the case (not shown) of a connection defect of the antenna A5, the defect is, in the first instance, detected because of the decrease of the currents flowing through the terminals B1 and B2, resulting in canceling the current i. The comparison them permits identifying the disconnection of the antenna A5 because the single current measured is to be that flowing through the terminal B2, equal to i' the reference value of the current flowing through the half bridge.

According to the second embodiment shown in FIG. 5, one of the antennas A7 is connected to the amplifier Am according to a complete bridge mounting constituted by two electrical connection branches P9, P10 each connected to one of the poles of said antenna and to one of the connection terminals B1, B2.

The second antenna A8 of this amplification circuit is itself connected according to a half-bridge mounting constituted by a connection to ground of one of the poles of said antenna, and a branch P11 of electrical connection of the other pole of this antenna A8 to one of the connection branches P10 of the complete bridge.

In an identical manner, the third antenna A9 of this amplification circuit is also connected according to a half-bridge mounting, connected by a branch P12 of the electrical connection to the other connection branch P9 of the complete bridge.

According to this embodiment, if the current flowing in the electrical connection branches P9, P10 of the complete bridge has a reference value i, and the currents flowing in the electrical connection branches P11 and P12 of the half bridges respectively has the reference values i' and i", then:

the reference value of the current flowing through the terminal B1 is equal to i+i"

and the reference value of the current flowing through the terminal B2 is equal to i+i'.

During normal functioning of the amplification circuit, and as shown in FIG. 5, the currents measured at each of the terminals B1 and B2 are substantially equal to the memorized reference values and hence a value i+i" for the terminal B1 and i+i' for the terminal B2.

Figure 6:
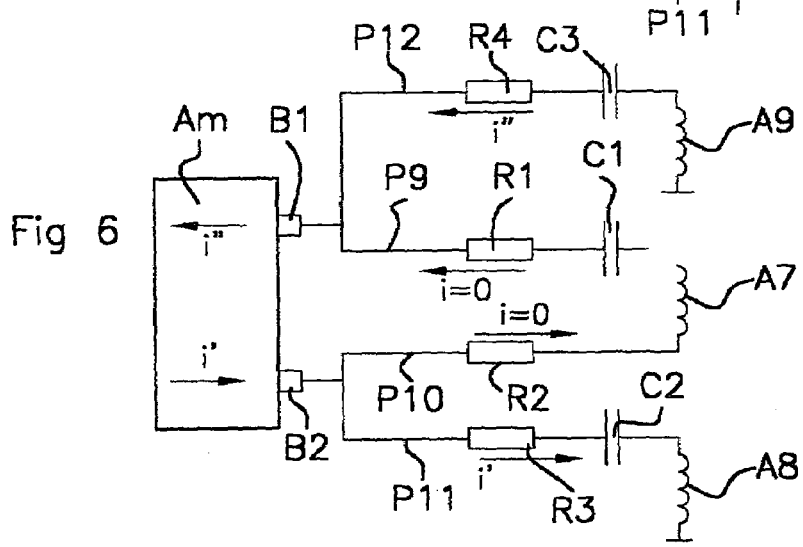
FIGS. 6 and 7 are schematics of this second embodiment shown with a connection defect (different from one figure to the other).

On the other hand, upon a connection defect of the antenna A7 connected to the complete-bridge mounting, and as shown in FIG. 6, the defect is, in the first instance, detected because of the decrease of the current passing through the terminals B1 and B2, resulting in translation of the current i. The comparison then permits identifying the disconnection of antenna A7 because the measured currents flowing through the terminals B1 and B2 are respectively equal to i" the reference value of the current flowing through the half bridge P12, and the reference value i' of the current flowing through the half bridge P11.

Figure 7:
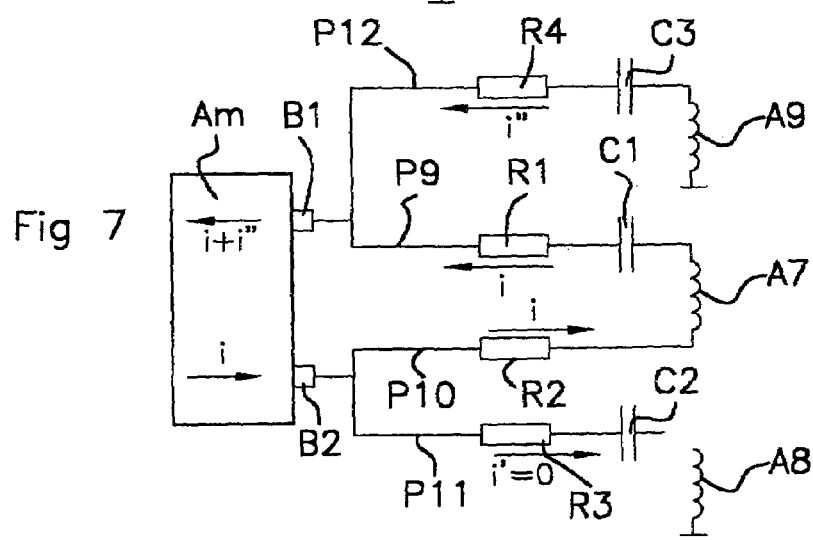

In the case of a connection defect of one of the antennas, for example A8, connected according to a half-bridge mounting, and as shown in FIG. 7, the measured value for the current passing through the terminal B1 remains unchanged and is equal to i+i", but a decrease of the value flowing through the terminal B2 is detected because of the cancellation of the current i', such that a connection defect in the first instance is detected.

A comparison between the measured values of the currents flowing through the two terminals B1 and B2 and the reference values, then permits detecting only the current i flowing through the terminal B2, such that the defect necessarily arises from a disconnection of the antenna A8.

Thus, the process according to the invention permits, not only increasing to three the number of electrical loads that can be connected to a pair of connection terminals, but also diagnosing a possible connection defect.

What is claimed is:

1. Process for connection of electrical loads (A5, A6; A7, A8, A9) to terminals (B1, B2) of an amplifier (Am), and for detection of a possible connection defect of said electrical loads, said process being characterized in that:

an electrical load (A5; A7) is connected to two terminals (B1, B2) of the amplifier (Am) according to a complete-bridge mounting consisting in connecting each of the poles of said electrical load to one of said terminals by means of an electrical connection branch (P6, P7; P9, P10)

connecting at least one second electrical load (A6; A8, A9) according to a half-bridge mounting consisting in connecting one of the poles of each of said electrical loads to ground, and the other pole of this electrical load to one of the connection branches (P7; P9, P10) of the complete bridge, by an electrical connection branch (P8; P11, P12), in a preliminary phase, measuring and memorizing reference values representative of currents flowing in each of the connection branches (P6–P8; P9–P12) of the complete-bridge mounting and half-bridge mountings, and deducing from these measurements and memorizing reference values of the currents flowing through each of the two terminals (B1, B2), and during operation of the amplifier (Am), measuring the current passing through each of the two terminals (B1, B2), comparing each measured value to the corresponding memorized reference value, so as to detect a possible decrease of the measured current representative of a connection defect in a connection branch (P6–P8; P9–P12) connected to the terminal in question, and upon a significant decrease of at least one of the measured currents, carrying out a comparison of the measured values of the two currents each flowing through the two terminals (B1, B2) with memorized reference values representative of the currents flowing in each of the connection branches, so as to deduce therefrom the connection branch or branches containing a connection defect of an electrical load (A5, A6; A7–A9).

2. Process according to claim 1, wherein a first electrical load (A5) is connected, having a given electrical consumption, to two terminals (B1, B2) of the amplifier (Am), according to a complete-bridge mounting (P6, P7), and a second electrical load (A6) having an electrical energy consumption less than that of the first electrical load (A5), according to a half-bridge mounting (P8) connected to one of the connection branches (P7) of the complete bridge mounting.

3. Process according to claim 1, wherein a first electrical load (A7) is connected to two terminals (B1, B2) of the amplifier (Am), according to a complete-bridge mounting (P9, P10), and two other electrical loads (A8, A9), according to half-bridge mountings (P11, P12) connected respectively to one of the connection branches (P9, P10) of the complete bridge mounting.

4. Process according to claim 1, wherein the connected electrical loads (A5, A6; A7–A9) consist of antennas.

* * * * *